(12) United States Patent
Sano

(10) Patent No.: US 10,845,419 B2
(45) Date of Patent: Nov. 24, 2020

(54) ASSEMBLED BATTERY CIRCUIT, CAPACITANCE COEFFICIENT DETECTION METHOD, AND CAPACITANCE COEFFICIENT DETECTION PROGRAM

(71) Applicant: Murata Manufacturing Co., Ltd., Nagaokakyo (JP)

(72) Inventor: Kosuke Sano, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 328 days.

(21) Appl. No.: 16/124,436

(22) Filed: Sep. 7, 2018

(65) Prior Publication Data

US 2019/0004121 A1    Jan. 3, 2019

Related U.S. Application Data

(63) Continuation of application No. PCT/JP2017/021382, filed on Jun. 8, 2017.

(30) Foreign Application Priority Data

Jun. 22, 2016    (JP) ................................ 2016-123247

(51) Int. Cl.
*H01M 10/44*    (2006.01)
*H01M 10/48*    (2006.01)
(Continued)

(52) U.S. Cl.
CPC ........... *G01R 31/389* (2019.01); *G01R 31/36* (2013.01); *G01R 31/3648* (2013.01);
(Continued)

(58) Field of Classification Search
CPC .. G01R 31/389; G01R 31/36; G01R 31/3648; G01R 31/378; G01R 31/3835;
(Continued)

(56) References Cited

U.S. PATENT DOCUMENTS

2007/0166607 A1* 7/2007 Okada ............... H01M 10/0525
429/90
2009/0123813 A1* 5/2009 Chiang ................. H01M 4/364
429/50
(Continued)

FOREIGN PATENT DOCUMENTS

JP             55150567 A   * 11/1980   ............ H01M 10/44
JP         2004032871 A       1/2004
(Continued)

OTHER PUBLICATIONS

C. Hou, J. Chen, J. Hu, H. Wang and S. Xu, "An online calibration algorithm of SOC for LiFePO4 battery by using characteristic curve," 2015 5th International Conference on Electric Utility Deregulation and Restructuring and Power Technologies (DRPT), Changsha, 2015, pp. 2108-2112 (Year: 2015).*

(Continued)

*Primary Examiner* — Daniel R Miller
(74) *Attorney, Agent, or Firm* — Arent Fox LLP

(57) ABSTRACT

An assembled battery is formed from multiple standard cells each having a standard capacitance and a single twofold cell having a capacitance twofold larger than the standard capacitance. When detecting the SOC of a reference standard cell, a system control circuit acquires from a memory a potential difference-SOC characteristic curve indicating the relationship between the potential difference between the reference standard cell and the twofold cell and the SOC of the reference standard cell. Moreover, the system control circuit detects the potential difference between the reference standard cell and the twofold cell, and then compares the detected potential difference with the potential difference-SOC characteristic curve to detect the SOC value of the reference standard cell.

20 Claims, 10 Drawing Sheets

(51) Int. Cl.
*G01R 31/36* (2020.01)
*H01M 10/42* (2006.01)
*G01R 31/389* (2019.01)
*H02J 7/00* (2006.01)

(52) U.S. Cl.
CPC ......... *H01M 10/44* (2013.01); *H01M 10/441* (2013.01); *H01M 10/48* (2013.01); *H01M 10/482* (2013.01); *H02J 7/0021* (2013.01); *H01M 2010/4271* (2013.01)

(58) Field of Classification Search
CPC .. G01R 31/392; H01M 10/441; H01M 10/48; H01M 10/482; H01M 10/44; H01M 2010/4271; H01M 2010/4292; H02J 7/0021; H02J 7/0048; H02J 7/0077; H02J 7/0078; H02J 7/00714; H02J 7/00716; H02J 7/00718
See application file for complete search history.

(56) References Cited

U.S. PATENT DOCUMENTS

| 2013/0022843 A1* | 1/2013 | Tohda | H01M 4/587 |
| | | | 429/50 |
| 2015/0056479 A1* | 2/2015 | Poehler | G01R 31/396 |
| | | | 429/50 |
| 2016/0268651 A1 | 9/2016 | Arai | |

FOREIGN PATENT DOCUMENTS

| JP | 2004311308 A | 11/2004 |
| JP | 2008166025 A | 7/2008 |
| JP | 2012173048 A | 9/2012 |
| JP | 2013003115 A | 1/2013 |
| JP | 2013089522 A | 5/2013 |
| WO | 2013179810 A1 | 12/2013 |
| WO | 2015059746 A1 | 4/2015 |

OTHER PUBLICATIONS

International Search Report issued for PCT/JP2017/021382, dated Sep. 5, 2017.
Written Opinion of the International Searching Authority issued for PCT/JP2017/021382, dated Sep. 5, 2017.

* cited by examiner

ASSEMBLED BATTERY CIRCUIT, CAPACITANCE COEFFICIENT DETECTION METHOD, AND CAPACITANCE COEFFICIENT DETECTION PROGRAM

CROSS REFERENCE TO RELATED APPLICATIONS

The present application is a continuation of PCT/JP2017/021382 filed Jun. 8, 2017, which claims priority to Japanese Patent Application No. 2016-123247, filed Jun. 22, 2016, the entire contents of each of which are incorporated herein by reference

TECHNICAL FIELD

The present disclosure relates to an assembled battery circuit, and, in particular, an assembled battery circuit that controls charge and discharge of an assembled battery formed from a standard cell with a standard capacitance and a specific cell with a capacitance exceeding the standard capacitance. The present disclosure also relates to a capacitance coefficient detection method for detecting the capacitance coefficient of the standard cell forming the assembled battery circuit and a capacitance coefficient detection program.

BACKGROUND

In general, to detect the state of charge (i.e., the "SOC": the capacitance coefficient of the battery, specifically, the depth of charge) of a battery, a voltage-SOC table is prepared and a voltage obtained by measuring the battery is compared to the voltage-SOC table.

However, for a battery with a large potential plateau region such as a positive LFP-negative Gr battery, it is not easy to detect SOC in the potential plateau region. That is, in actuality, the SOC in the potential plateau region is detected based on the integrated value of the SOC detected in a region other than the potential plateau region and the amount of current after the detection. This method has a limited accuracy of detection of the SOC.

As for the state of health (SOH: the capacitance coefficient, specifically, the degree of deterioration) of a general battery, the deterioration state of the battery can be determined by detecting that Δcapacitance/ΔV (which is the ratio of the fluctuation range of capacitance to the fluctuation range of potential) becomes smaller with advancement in deterioration. However, for a positive LFP-negative Gr battery, the potential plateau region degenerates with advancement in deterioration, but Δ capacitance/ΔV remains unchanged, and it is thus not possible to determine the state of deterioration. That is, in a battery with a large potential plateau region, SOH is quantified by integrating the current value and there is a limit on the accuracy of detection of SOH.

In view of the foregoing, Patent Document 1 (identified below) describes an assembled battery formed by connecting in series a depth-of-charge detection lithium-ion secondary battery (detection cell) and a non-depth-of-charge detection lithium-ion secondary battery (normal cell) different in initial battery capacitance. This makes it possible to evaluate the depth of charge even during charging or discharging of large current without the need for a complicated determination circuit.

Patent Document 1: Japanese Patent Application Laid-Open No. 2013-89522.

To use an assembled battery as described in Patent Document 1 stably for a long time, it is necessary to prepare separately a voltage-SOC table based on the deterioration state of the detection cell and a voltage-SOC table based on the deterioration state of the normal cell, and monitor the deterioration states of the cells and reset SOCs (making the SOCs uniform between the cells).

However, monitoring and resetting two kinds of cells different in performance and deterioration characteristics would increase complexity. In addition, for power batteries flowing large current with low resistance, it is difficult to design two kinds of cells different in material. Further, for a conventional winding can-type battery, there is no degree of freedom for the can and it is not easy to change the design by increasing capacitance or the like. Therefore, the assembled battery as described in Patent Document 1 is of no practical use.

SUMMARY OF THE INVENTION

Accordingly, a main object of the present disclosure is to provide an assembled battery circuit that is configured to detect a capacitance coefficient even in the potential plateau region in an easy and accurate manner.

Thus, according to an exemplary aspect, an assembled battery circuit (10) controls charging and discharging of an assembled battery (20) formed from a standard cell (20st) having a standard capacitance and a specific cell (20tw) having a capacitance exceeding the standard capacitance. In an exemplary aspect, the assembled battery circuit includes a potential difference-capacitance coefficient characteristic curve acquisition unit (S1, S31) that acquires from a memory (16m) a potential difference-capacitance coefficient characteristic curve (CVdf) indicating a relationship between a potential difference between the standard cell and the specific cell and a standard cell capacitance coefficient indicating the present capacitance of the standard cell with respect to a fully-charged capacitance of the standard cell before deterioration. Moreover, a potential difference detection unit (i.e., a potential difference detector) (S19, S37) is included that detects the potential difference between the standard cell and the specific cell and a standard cell capacitance coefficient value detection unit (i.e., a standard cell capacitance coefficient value detector) (S21, S39) is provided that compares the potential difference detected by the potential difference detection unit with the potential difference-capacitance coefficient characteristic curve acquired by the potential difference-capacitance coefficient characteristic curve acquisition unit to detect the present value of the standard cell capacitance coefficient. It should be appreciated that each of these exemplary "units" can be implemented by the system control circuit described below and/or as one or more sub-components thereof.

According to the exemplary embodiment, the standard cell has the standard capacitance (i.e., one or more first capacitances) and the specific cell has the capacitance exceeding the standard capacitance (the capacitance of the specific cell can be considered a second capacitance). Accordingly, the potential difference may fluctuate significantly on the potential difference-capacitance coefficient characteristic curve even in the capacitance coefficient region (i.e., the potential plateau region) with less fluctuation in the voltage of the standard cell. Using this potential difference-capacitance coefficient characteristic curve enables the detection of the capacitance coefficient of the standard cell even in the potential plateau region in an easy and accurate manner.

Preferably, the assembled battery circuit further includes a cell voltage-capacitance coefficient characteristic curve acquisition unit (S1, S33) that acquires from the memory a standard cell voltage-capacitance coefficient characteristic curve (CVst) indicating a relationship between voltage of the standard cell and the standard cell capacitance coefficient and/or a specific cell voltage-capacitance coefficient characteristic curve (CVtw) indicating a relationship between voltage of the specific cell and a specific cell capacitance coefficient indicating the present capacitance of the specific cell with respect to a fully-charged capacitance of the specific cell before deterioration; and a standard cell capacitance coefficient value selection unit (S23, S25, S41, and S43) (i.e., a standard cell capacitance coefficient value selector) that, when the number of values of the standard cell capacitance coefficient detected by the standard cell capacitance coefficient value detection unit is two or more, selects the unique value of the standard cell capacitance coefficient based on the characteristic curve acquired by the cell voltage-capacitance coefficient characteristic curve acquisition unit.

Referring to the standard cell voltage-capacitance coefficient characteristic curve and/or the specific cell voltage-capacitance coefficient characteristic curve enables the risk of wrong detection of the capacitance coefficient value of the standard cell to be reduced.

Preferably, the assembled battery circuit further includes a standard cell capacitance coefficient value output unit (S27) that outputs the value of the standard cell capacitance coefficient detected by the standard cell capacitance coefficient value detection unit. Accordingly, it is easy to check the capacitance coefficient value of the standard cell.

Preferably, the number of the standard cell is more than one (i.e., a plurality), and each of the potential difference detection unit and the standard cell capacitance coefficient value detection unit performs a detection process on each of the standard cells. Moreover, the assembled battery circuit further includes a balance adjustment unit (S49 to S63) (i.e., a balance adjustor) that is configured to adjust a charging balance among the standard cells based on the value of the standard cell capacitance coefficient detected by the standard cell capacitance coefficient value detection unit.

Referring to the potential difference-capacitance coefficient characteristic curve enables a charging balance to be adjusted between the standard cells even in the potential plateau region.

Preferably, the specific cell is connected in series to the standard cell such that the voltage of the specific cell and the voltage of the standard cell coincide with each other in a position where the values of the standard cell capacitance coefficient and the specific cell capacitance coefficient are zero. This configuration eliminates the need for adjusting a balance between the specific cell and the standard cell.

In another exemplary embodiment, a capacitance coefficient detection method is disclosed that is executed by an assembled battery circuit (10) that controls charging and discharging of an assembled battery (20) that includes a standard cell (20st) having a standard capacitance and a specific cell (20tw) having a capacitance exceeding the standard capacitance. In this exemplary aspect, the capacitance coefficient detection method includes a potential difference-capacitance coefficient characteristic curve acquisition step (S1, S31) of acquiring from a memory (16m) a potential difference-capacitance coefficient characteristic curve (CVdf) indicating a relationship between a potential difference between the standard cell and the specific cell and a standard cell capacitance coefficient indicating the present capacitance of the standard cell with respect to a fully-charged capacitance of the standard cell before deterioration; a potential difference detection step (S19, S37) of detecting the potential difference between the standard cell and the specific cell; and a standard cell capacitance coefficient value detection step (S21, S39) of comparing the potential difference detected in the potential difference detection step with the potential difference-capacitance coefficient characteristic curve acquired in the potential difference-capacitance coefficient characteristic curve acquisition step to detect the present value of the standard cell capacitance coefficient.

According to another exemplary embodiment, a capacitance coefficient detection program is disclosed for causing an assembled battery circuit (10) that controls charging and discharging of an assembled battery (20) that includes a standard cell (20st) having a standard capacitance and a specific cell (20tw) having a capacitance exceeding the standard capacitance. In this aspect, when executed by a processor, the capacitance coefficient detection program is configured to execute a potential difference-capacitance coefficient characteristic curve acquisition step (S1, S31) of acquiring from a memory (16m) a potential difference-capacitance coefficient characteristic curve (CVdf) indicating a relationship between a potential difference between the standard cell and the specific cell and a standard cell capacitance coefficient indicating the present capacitance of the standard cell with respect to a fully-charged capacitance of the standard cell before deterioration; a potential difference detection step (S19, S37) of detecting the potential difference between the standard cell and the specific cell; and a standard cell capacitance coefficient value detection step (S21, S39) of comparing the potential difference detected in the potential difference detection step with the potential difference-capacitance coefficient characteristic curve acquired in the potential difference-capacitance coefficient characteristic curve acquisition step to detect the present value of the standard cell capacitance coefficient.

According to the exemplary embodiments of the present disclosure, it is possible to detect the capacitance coefficient even in the potential plateau region in an easy and accurate manner.

The foregoing and other objects, features, and advantages of the present invention will be further clarified by the following detailed descriptions of embodiments with reference to the drawings.

DETAILED DESCRIPTION

Figure 1:
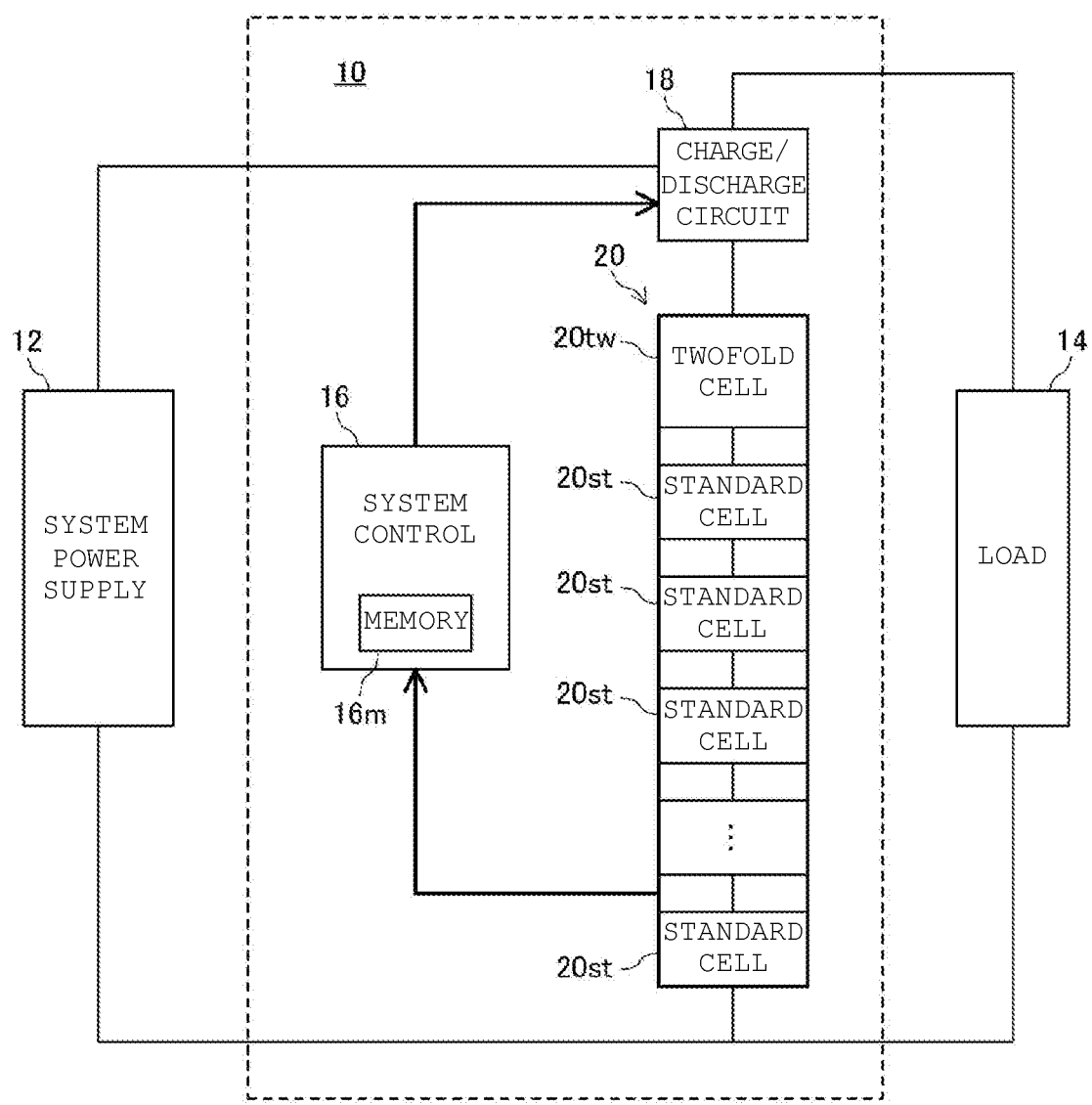
FIG. 1 is a block diagram of an assembled battery circuit and its periphery according to an exemplary embodiment.

Referring to FIG. 1, an assembled battery circuit 10 according to an exemplary embodiment includes a system control circuit 16 that controls charging and discharging of an assembled battery 20 through a charge/discharge circuit 18. Moreover, the charge/discharge circuit 18 charges the assembled battery 20 with power supplied from a system power supply 12 and/or discharges power from the assembled battery 20 in response to a load 14 under control of the system control circuit 16.

In an exemplary aspect, the assembled battery 20 is formed by connecting in series Kmax standard cells 20st and a single twofold cell (specific cell) 20tw. The plurality of standard cells 20st and the twofold cell 20tw are formed by stacking positive electrodes and negative electrodes with separators interposed therebetween, storing in a laminate, charging with an electrolyte solution, and then sealing. The constant Kmax is an integer of 2 or larger, for example, "7" in an aspect. The standard cells 20st have a standard capacitance (also referred to as a "first capacitance"), and the twofold cell 20tw has a capacitance twofold larger (also referred to as a "second capacitance") than the standard capacitance. In other words, the capacitance of the twofold cell 20tw is at least two times the capacitance of the standard cells 20st.

Figure 2:
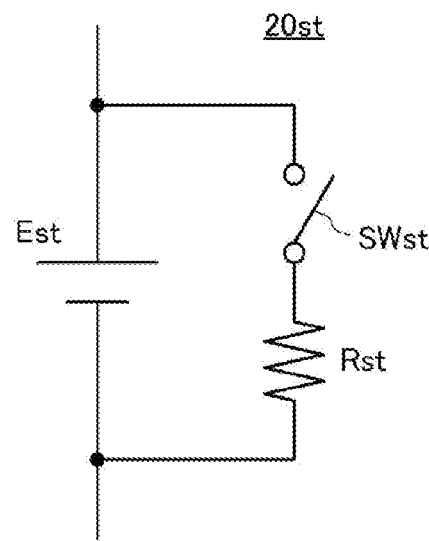
FIG. 2 is a circuit diagram of an example of configuration of a standard cell.

In an exemplary aspect, each of the standard cells 20st is specifically configured as illustrated in FIG. 2. Referring to FIG. 2, a switch SWst has one end connected to a positive electrode of a cell Est and the other end connected to one end of an external short-circuit resistor Rst. The other end of the external short-circuit resistor Rst is connected to the negative electrode of the cell Est. The value of electric current discharged from the cell Est by turning on the switch SWst is determined by the terminal voltage value of the cell Est and the value of the external short-circuit resistor Rst.

The state of charge (referred to as "SOC") is one of the parameters that indicates the respective states of the standard cells 20st and the twofold cell 20tw. In this example, in particular, the SOC of the standard cells 20st will be defined as "the present charge capacitance of the standard cells 20st with respect to the fully-charged capacitance of the standard cells 20st before deterioration", and the SOC of the twofold cell 20tw will be defined as "the present charge capacitance of the twofold cell 20tw with respect to the fully-charged capacitance of the twofold cell 20tw before deterioration".

According to an exemplary aspect, for each of the twofold cell 20tw and the standard cells 20st, the positive electrode and the negative electrode are made respectively from olivine-type lithium iron phosphate (LFP) and graphite (Gr), and the AC ratio (the opposite charge capacitance ratio of the positive electrode and the negative electrode) is 1.75. The region with a positive electrode SOC gradient of 2 mV/SOC % or less is 30% or more of the cell effective SOC, and the region with a negative electrode SOC gradient of 2.5 mV/SOC % is 30% or more of the cell effective SOC.

However, the twofold cell 20tw has a capacitance of 9.0 Ah, whereas the standard cells 20st have a capacitance of 4.5 Ah. That is, according to the exemplary aspect, the material and design of the twofold cell 20tw is identical to the material and design of the standard cells 20st, and the difference between the twofold cell 20tw and the standard cells 20st is only capacitance according to the exemplary embodiment.

Figure 3:
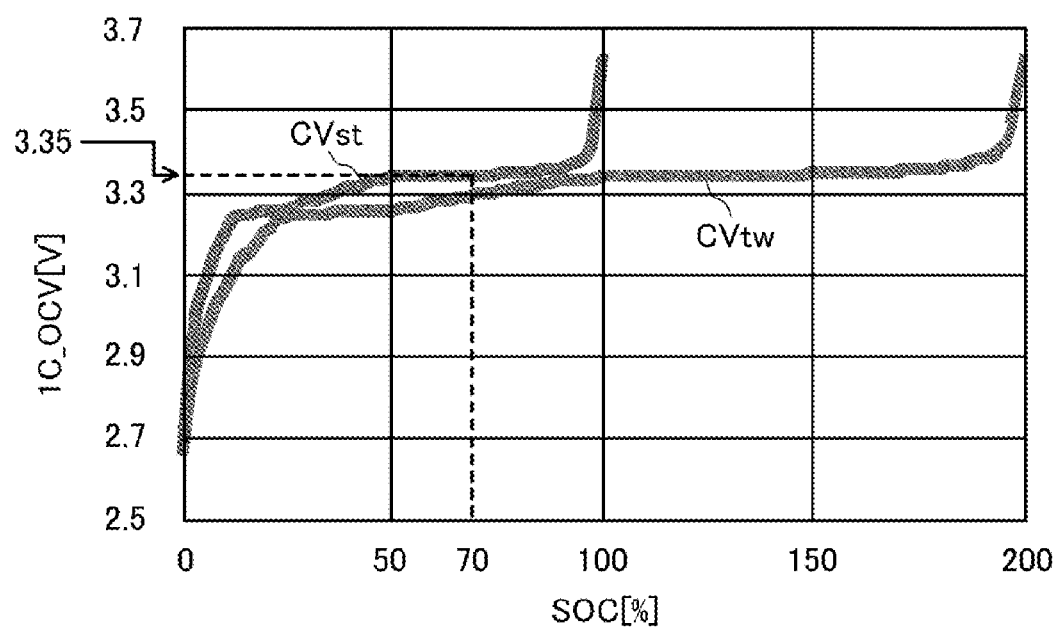
FIG. 3 is a graph illustrating an example of relationship between open-circuit voltage and SOC of a twofold cell or the standard cell.

Referring to FIG. 3, a curve CVst indicates the relationship between open-circuit voltage (referred to as "OCV") of the standard cell 20st and the SOC of the standard cell 20st, and a curve CVtw indicates the relationship between open-circuit voltage of the twofold cell 20tw and the SOC of the twofold cell 20tw. Hereinafter, the curve CVst will be defined as "standard cell voltage-SOC characteristic curve", and the curve CVtw will be defined as "twofold cell voltage-SOC characteristic curve".

Referring to FIG. 3, the open-circuit voltage value of the twofold cell 20tw coincides with the open-circuit voltages of the standard cells 20st at a position corresponding to SOC=0%. In other words, the twofold cell 20tw and the Kmax standard cells 20st are connected in series such that the open-circuit voltages of the cells coincide with each other at the position corresponding to SOC=0%.

In addition, since the material and design of the twofold cell 20tw are identical to the material and design of the standard cells 20st as described above, the twofold cell voltage-SOC characteristic curve CVtw overlaps a curve obtained by extending the standard cell voltage-SOC characteristic curve CVst twice in the lateral axis direction.

That is, each of the twofold cell voltage-SOC characteristic curve CVtw and the standard cell voltage-SOC characteristic curve CVst has a potential plateau region (i.e., SOC region with less voltage fluctuation), but the twofold cell 20tw and the standard cells 20st are different in capacitance as noted above, and thus the position of the potential plateau region is different between the twofold cell voltage-SOC characteristic curve CVtw and the standard cell voltage-SOC characteristic curve CVst.

It should be appreciated that the assembled battery 20 has the Kmax standard cells 20st that may have individual differences, and thus the relationship between the open-circuit voltage of the standard cell 20st and the SOC of the standard cell 20st slightly varies among the individual standard cells 20st.

In addition, the relationship between the open-circuit voltage of the standard cell 20st and the SOC of the standard cell 20st varies depending on the operating environments of the assembled battery circuit 10 (e.g., charging or discharging and the temperature of the assembled battery 20), and the relationship between the open-circuit voltage and the SOC of the twofold cell 20tw also varies depending on the operating environments of the assembled battery circuit 10.

Based on the foregoing, the memory 16m (which can be any form of electronic memory) stores in advance (i.e., predetermined or preset) a number of standard cell voltage-SOC characteristic curves CVst equal to the number of Kmax×operating environments and a number of twofold cell voltage-SOC characteristic curves CVtw equal to the number of operating environments.

Figure 4:
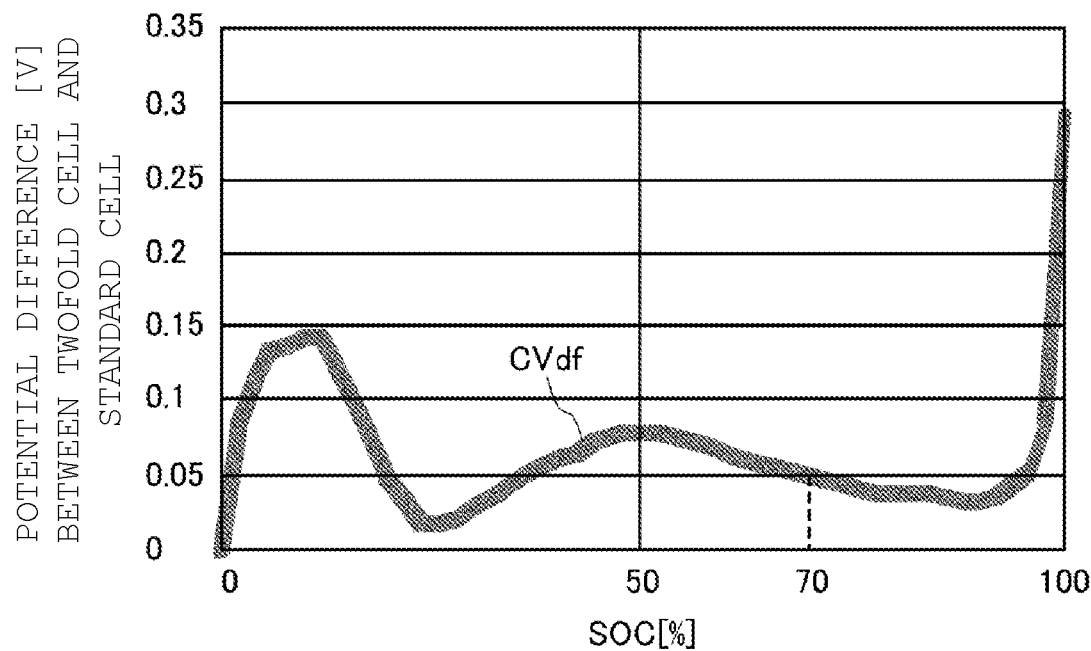
FIG. 4 is a graph illustrating an example of relationship between a potential difference between the twofold cell and the standard cell and SOC.

Referring to FIG. 4, a curve CVdf indicates the relationship between the difference in open-circuit voltage (i.e., potential difference) between the twofold cell 20tw and the standard cell 20st and the SOC of the standard cell 20st. The potential difference between the twofold cell 20tw and the standard cell 20st reflects the differences between the twofold cell voltage-SOC characteristic curve CVtw and the standard cell voltage-SOC characteristic curve CVst, and fluctuates significantly in the entire SOC region. That is, the curve CVdf has a plurality of extreme values, and no plateau region appears in the curve CVdf. Hereinafter, the curve CVdf will be defined as "potential difference-SOC characteristic curve".

As described above, the number of the standard cell voltage-SOC characteristic curves CVst is equal to the number of Kmax×operating environments, and the number of the twofold cell voltage-SOC characteristic curves CVtw is equal to the number of the operating environments. Therefore, the memory 16m stores in advance a number of potential difference-SOC characteristic curves CVdf equal to the number of Kmax×operating environments.

However, the twofold cell 20tw and the standard cells 20st identical in material and design would deteriorate with age in the same manner. For example, when the twofold cell 20tw and the standard cells 20st gradually deteriorate in output characteristics to 73%, the twofold cell voltage-SOC characteristic curve CVtw and the standard cell voltage-SOC characteristic curve CVst draw paths illustrated in FIG. 5. That is, the standard cell voltage-SOC characteristic curve CVst and the twofold cell voltage-SOC characteristic curve CVtw are compressed at the same compression rate in the region other than the low-SOC region.

Figure 5:
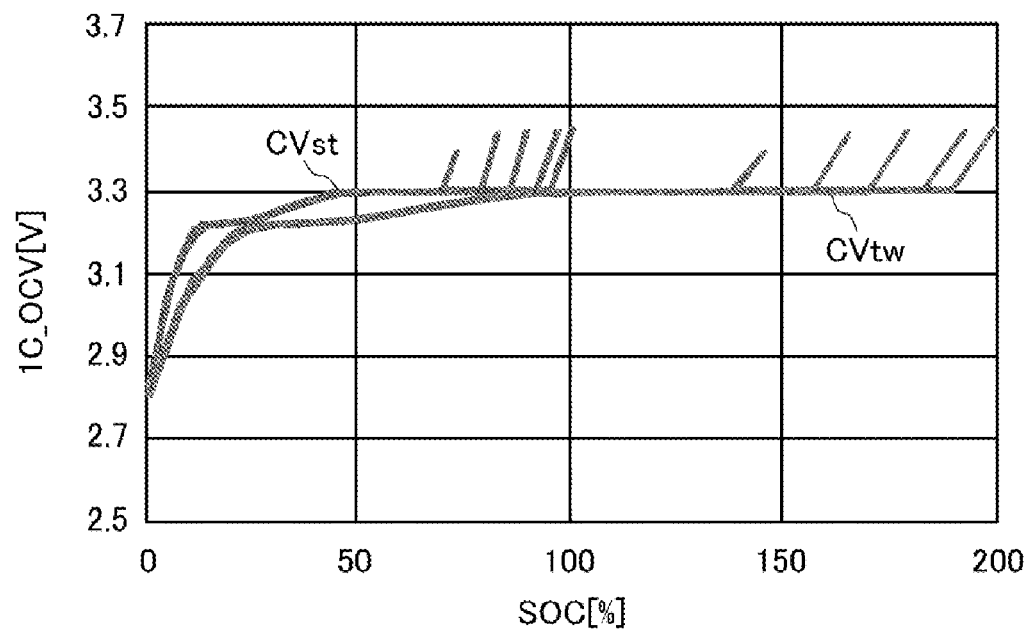
FIG. 5 is a graph illustrating another example of relationship between open-circuit voltage and SOC of the twofold cell or the standard cell.

Each of the twofold cell voltage-SOC characteristic curve CVtw and the standard cell voltage-SOC characteristic curve CVst illustrated in FIG. 5 indicates the path in which the output characteristics deteriorate from 100% to 97%, 90%, 83%, and 73%.

Figure 6:
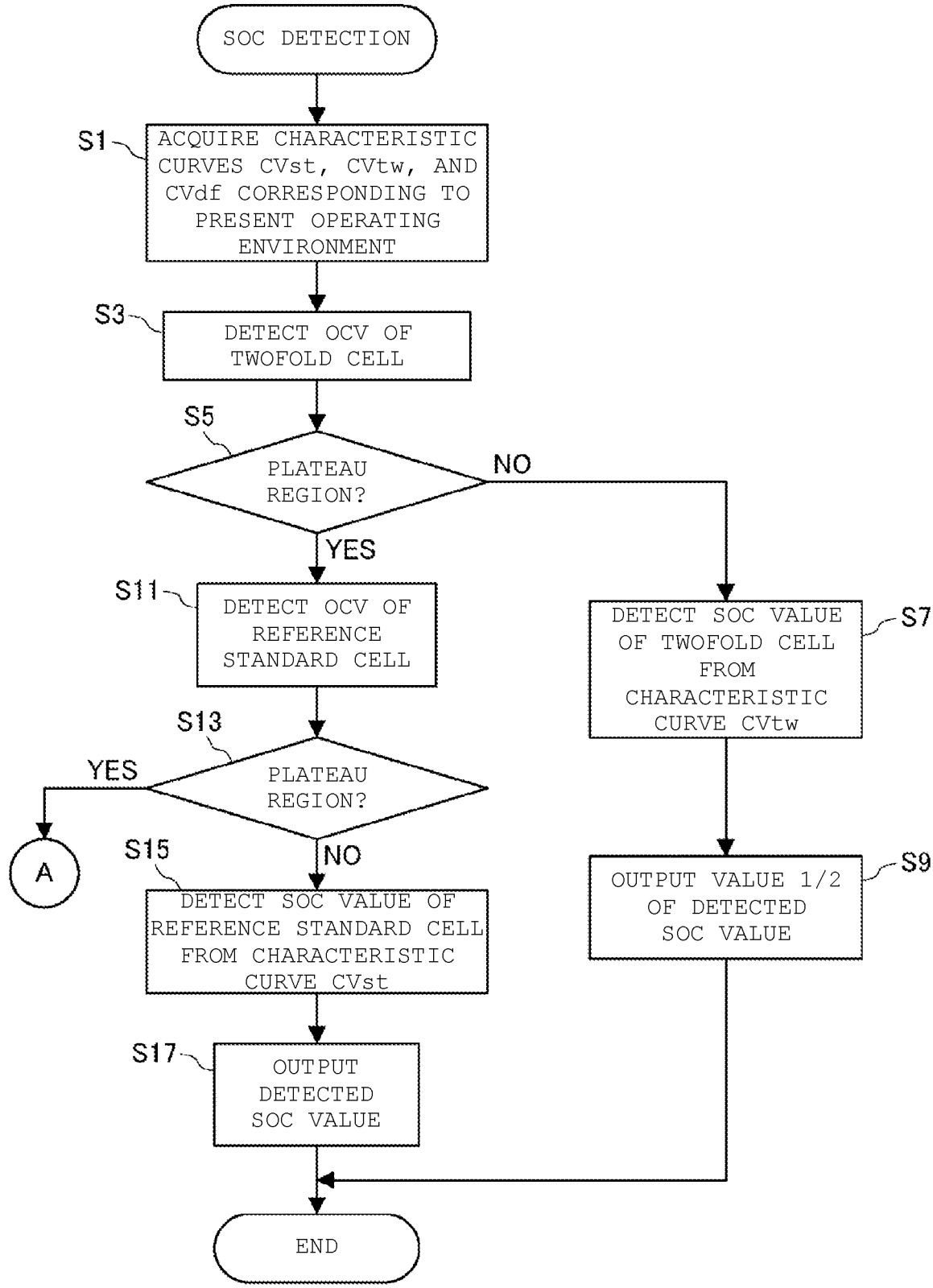
FIG. 6 is a flowchart of exemplary operations performed by a system control circuit illustrated in FIG. 1.
Figure 7:
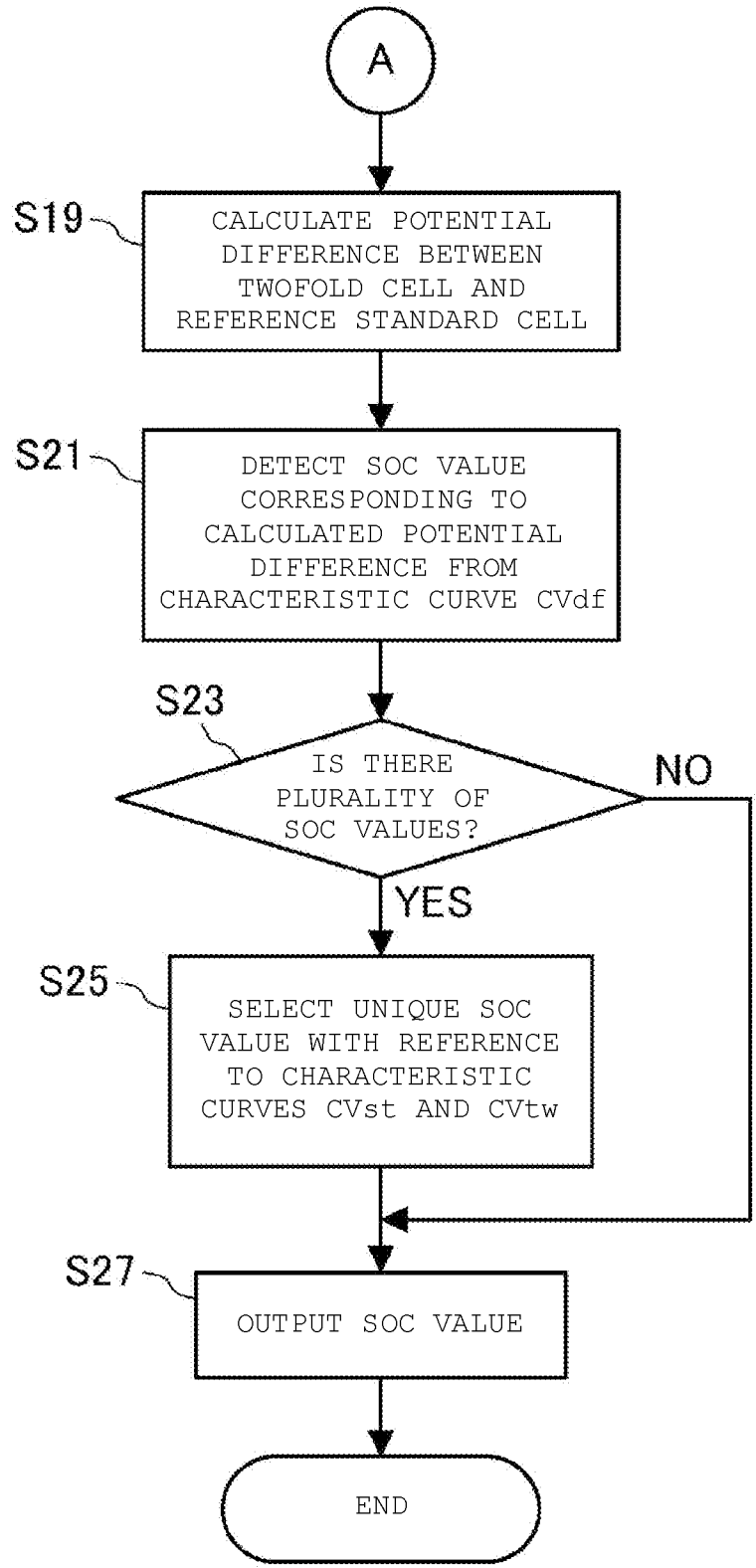
FIG. 7 is a flowchart of exemplary operations performed by the system control circuit illustrated in FIG. 1.
Figure 8:
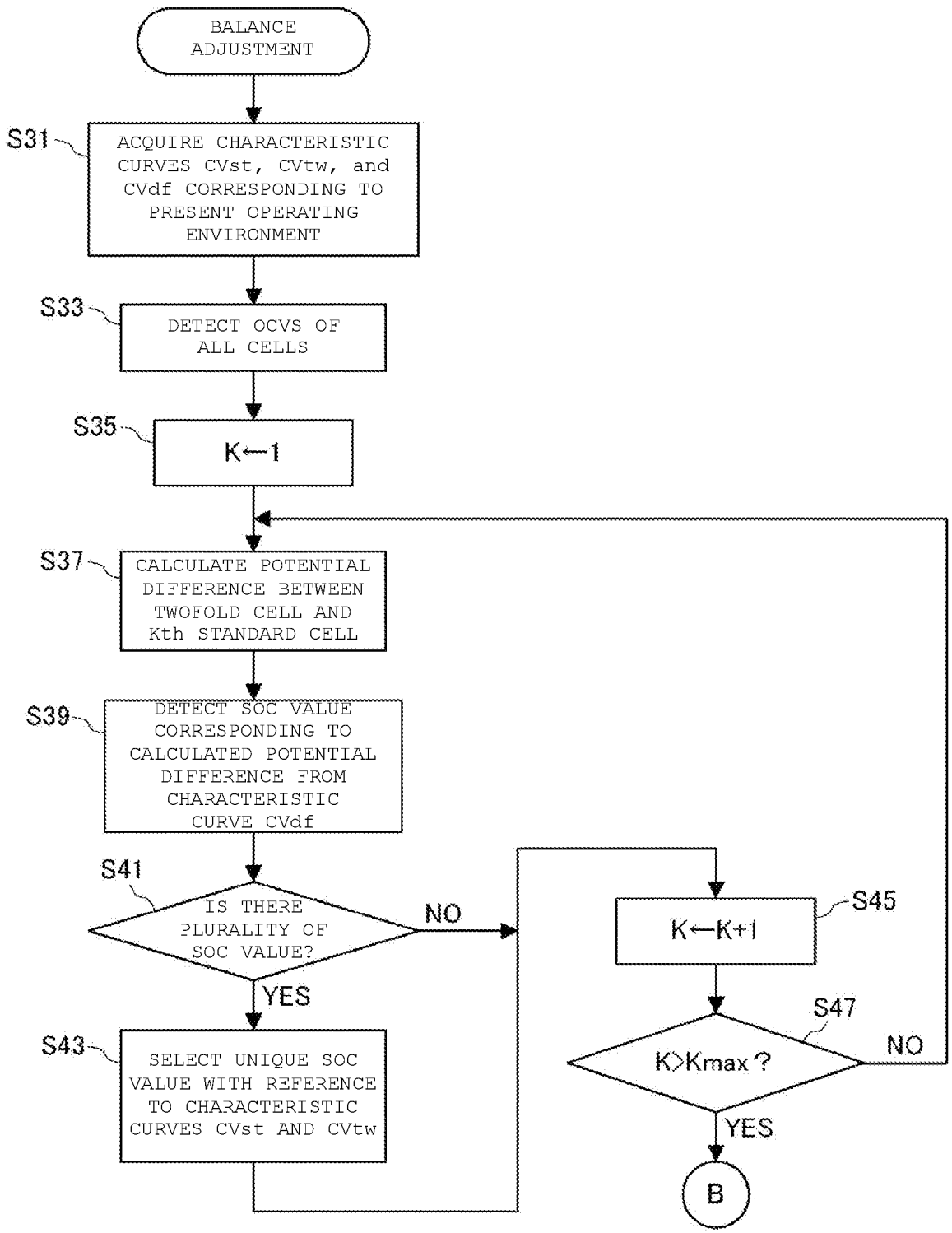
FIG. 8 is a flowchart of exemplary operations performed by the system control circuit illustrated in FIG. 1.
Figure 9:
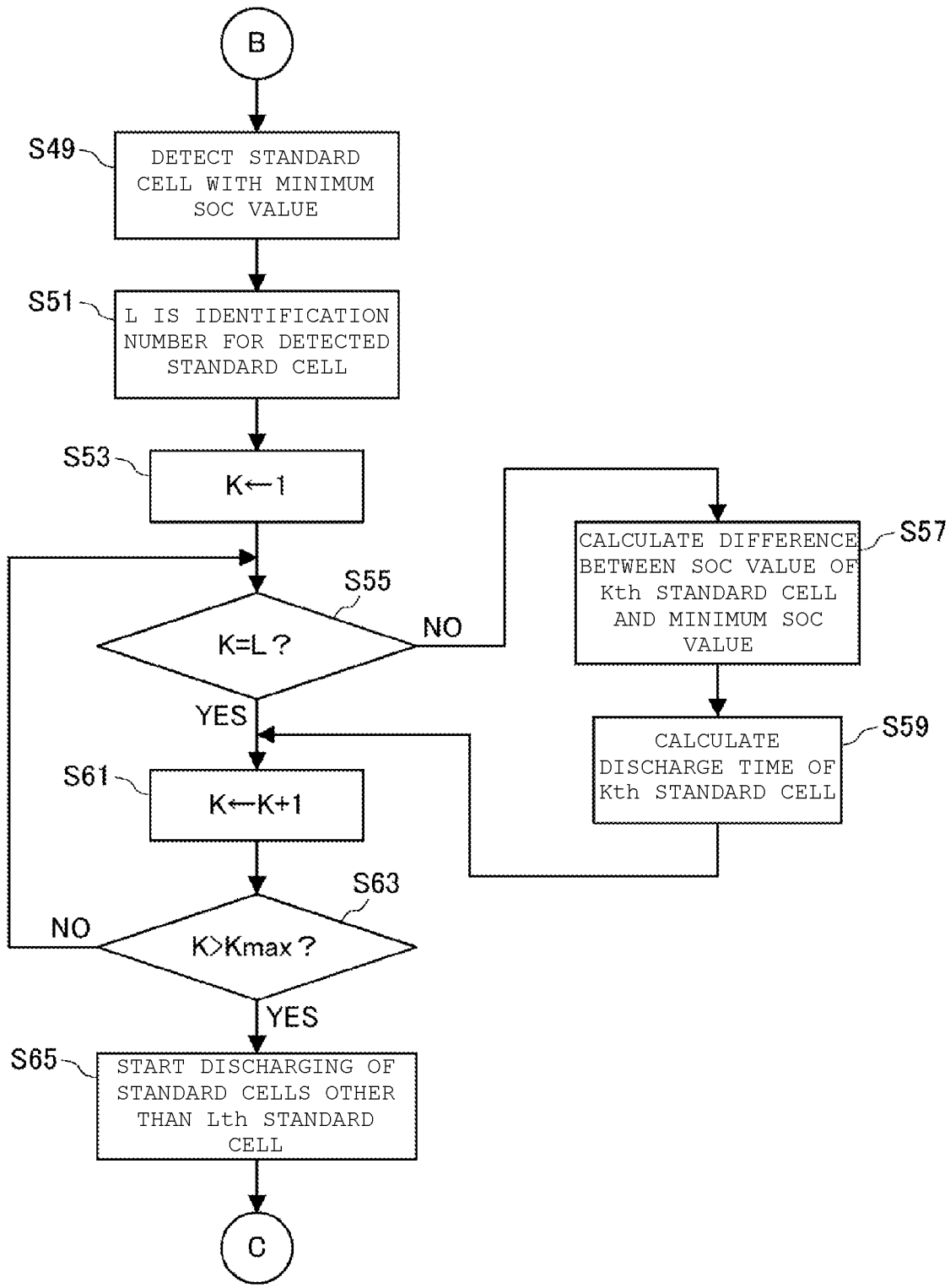
FIG. 9 is a flowchart of exemplary operations performed by the system control circuit illustrated in FIG. 1.
Figure 10:
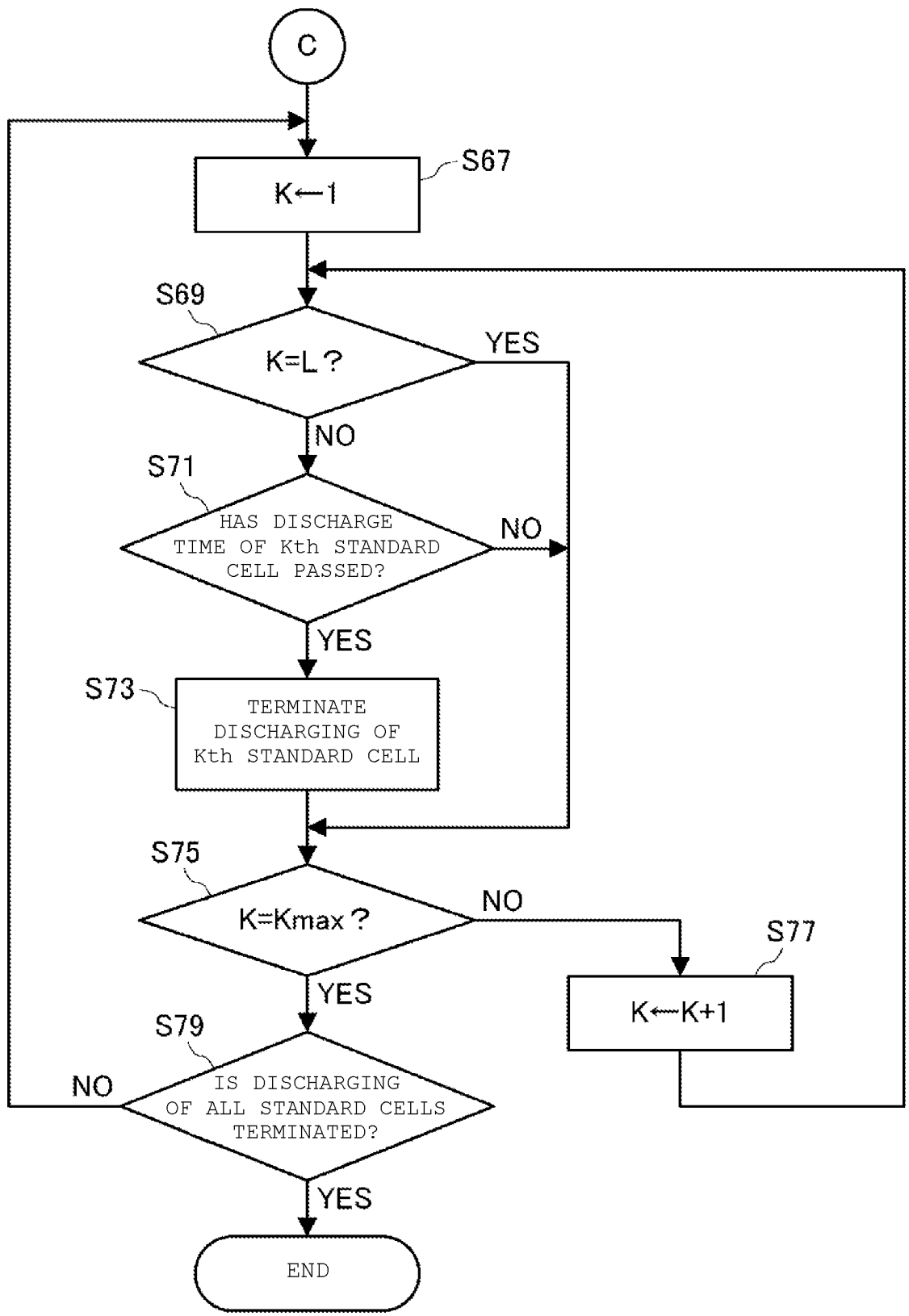
FIG. 10 is a flowchart of exemplary operations performed by the system control circuit illustrated in FIG. 1.

According to the exemplary embodiment, the system control circuit 16 (e.g., a processor configured to execute software for performing the algorithms disclosed herein) repeatedly detects the SOCs of the standard cells 20st according to the flowchart illustrated in FIGS. 6 and 7, and repeatedly adjusts the charge balance between the standard cells 20st and the twofold cell 20tw according to the flowchart illustrated in FIGS. 8 to 10. The memory 16m also stores control programs (i.e., the algorithms described herein) corresponding to these process flows.

In particular, referring to FIG. 6, initially in step S1, the system control circuit 16 acquires from the memory 16m the twofold cell voltage-SOC characteristic curve CVtw, the standard cell voltage-SOC characteristic curve CVst, and the potential difference-SOC characteristic curve CVdf corresponding to the present operating environment.

As for the standard cell voltage-SOC characteristic curve CVst, the system control circuit 16 acquires a curve indicating the relationship between the open-circuit voltage of a reference standard cell (i.e., a standard cell 20st specified in advance from among the Kmax standard cells 20st) and the SOC of the reference standard cell 20st. As for the potential difference-SOC characteristic curve CVdf, the system control circuit 16 acquires a curve indicating the relationship between the potential difference between the twofold cell 20tw and the reference standard cell 20st and the SOC of the reference standard cell 20st. It is reiterated that each such curve described herein is stored in memory 16m accordingly to an exemplary embodiment.

In step S3, the system control circuit 16 detects the present open-circuit voltage of the twofold cell 20tw. In step S5, the system control circuit 16 determines whether the SOC value corresponding to the detected open-circuit voltage falls within the potential plateau region on the twofold cell voltage-SOC characteristic curve CVtw acquired in step S1. As further shown, when the determination result of the system control circuit 16 is NO, the system control circuit 16 proceeds to step S7, and when the determination result of the system control circuit 16 is YES, the system control circuit 16 proceeds to step S11.

In step S7, the system control circuit 16 compares the open-circuit voltage detected in step S3 with the twofold cell voltage-SOC characteristic curve CVtw acquired in step S1 to detect the present SOC value of the twofold cell 20tw. In step S9, the system control circuit 16 outputs the value ½ of the detected SOC value as the present SOC value of the standard cell 20st to a monitor (not illustrated) for display thereon, and then terminates this SOC detection process.

In step S11, the system control circuit 16 detects the present open-circuit voltage of the reference standard cell 20st. In step S13, the system control circuit 16 determines whether the SOC value corresponding to the detected open-circuit voltage falls within the potential plateau region on the standard cell voltage-SOC characteristic curve CVst acquired in step S1. When the determination result is NO, the system control circuit 16 proceeds to step S15, and when the determination result is YES, the system control circuit 16 proceeds to step S19.

In step S15, the system control circuit 16 compares the open-circuit voltage detected in step S11 with the standard cell voltage-SOC characteristic curve CVst acquired in step S1 to detect the present SOC value (i.e., current SOC value) of the reference standard cell 20st. In step S17, the system control circuit 16 outputs the detected SOC value as the present SOC value of the standard cell 20st to the monitor, and then terminates this SOC detection process.

In step S19 described in FIG. 7, the system control circuit 16 calculates the present potential difference between the twofold cell 20tw and the reference standard cell 20st. In step S21, the system control circuit 16 detects one or more SOC values corresponding to the calculated potential difference on the potential difference-SOC characteristic curve CVdf acquired in step S1.

When the potential difference-SOC characteristic curve CVdf acquired in step S1 draws a curve as illustrated in FIG. 4 and the potential difference calculated in step S21 is 0.05V, the system control circuit 16 detects five SOC values in step S21.

In step S23, the system control circuit 16 determines whether the number of the detected SOC values is two or more. When the determination result of the system control circuit 16 is NO, the system control circuit 16 proceeds to step S27. When the determination result of the system control circuit 16 is YES, the system control circuit 16 executes step S25 as described below, and then proceeds to step S27.

In step S25, the system control circuit 16 refers to at least one of the standard cell voltage-SOC characteristic curve CVst and the twofold cell voltage-SOC characteristic curve CVtw acquired in step S1 to select the unique SOC value corresponding to the open-circuit voltage of the reference standard cell 20st. As illustrated in FIGS. 3 and 4 described above, when the open-circuit voltage of the reference standard cell 20st is 3.35V and the open-circuit voltage of the twofold cell 20tw is 3.3V, the system control circuit 16 selects "70%" as the unique SOC value in step S25.

In step S27, the system control circuit 16 outputs the thus detected or selected unique SOC value to the monitor and then terminates this SOC detection process.

Referring to FIG. 8, in step S31, the system control circuit 16 acquires from the memory 16m the twofold cell voltage-SOC characteristic curve CVtw, the Kmax standard cell voltage-SOC characteristic curves CVst, and the Kmax potential difference-SOC characteristic curves CVdf corresponding to the present operating environment.

In step S33, the system control circuit 16 detects the respective present open-circuit voltages of the twofold cell 20tw and the Kmax standard cells 20st. In step S35, the system control circuit 16 sets variable K to "1". In step S37, the system control circuit 16 calculates the present potential difference between the twofold cell 20tw and the K-th standard cell 20st. In step S39, the system control circuit 16 detects one or more SOC values corresponding to the calculated potential difference on the K-th potential difference-SOC characteristic curve CVdf acquired in step S31.

In step S41, the system control circuit 16 determines whether the number of the detected SOC values is two or more. When the determination result is NO, the system control circuit 16 proceeds to step S45. When the determination result is YES, the system control circuit 16 executes step S43 as described below, and then proceeds to step S45.

In step S43, the system control circuit 16 refers to at least one of the K-th standard cell voltage-SOC characteristic curve CVst acquired in step S31 and the twofold cell voltage-SOC characteristic curve CVtw to select the unique SOC value corresponding to the open-circuit voltage of the K-th standard cell 20st.

In step S45, the system control circuit 16 increments the variable K, and in step S47, the system control circuit 16 determines whether the variable K exceeds the constant Kmax. When the determination result is NO, the system control circuit 16 returns to step S37. When the determination result is YES, the system control circuit 16 proceeds to step S49.

In step S49, the system control circuit 16 detects the standard cell 20st with the minimum SOC value out of the Kmax standard cells 20st. In step S51, the system control circuit 16 sets the identification number of the detected standard cell 20st to variable L. In step S53, the system control circuit 16 sets the variable K to "1", and in step S55, the system control circuit 16 determines whether the variable K is equal to the variable L. When the determination result by the system control circuit 16 is YES, the system control circuit 16 proceeds to step S63. When the determination result by the system control circuit 16 is NO, the system control circuit 16 executes steps S57 to S61 as described below and then proceeds to step S63.

In step S57, the system control circuit 16 calculates the difference between the SOC value of the K-th standard cell 20st and the minimum SOC value (i.e., the SOC value of the L-th standard cell 20st).

In step S59, for the K-th standard cell 20st, the system control circuit 16 turns on the switch SWst, calculates a balance current value from the value of the external short-circuit resistor Rst and the characteristics of the cell Est, and calculates the discharge time of the K-th standard cell 20st based on the calculated balance current value and the difference calculated in step S57. The calculated discharge time refers to the time until the SOC value of the K-th standard cell 20st falls below the minimum SOC value.

In step S61, the system control circuit 16 increments the variable K, and in step S63, the system control circuit 16 determines whether the variable K exceeds the constant Kmax. When the determination result by the system control circuit 16 is NO, the system control circuit 16 returns to step S55. When the determination result by the system control circuit 16 is YES, the system control circuit 16 proceeds to step S65. In step S65, the system control circuit 16 turns on the switches SWst for the standard cells 20st except for the L-th standard cell 20st. Accordingly, discharging is started.

In step S67, the system control circuit 16 sets the variable K to "1". In step S69, the system control circuit 16 determines whether the variable K is equal to the variable L. In step S71, the system control circuit 16 determines whether the discharge time set for the K-th standard cell 20st has elapsed. When the determination result in step S69 by the system control circuit 16 is YES or the determination result in step S71 by the system control circuit 16 is NO, the system control circuit 16 proceeds to step S75. When the determination result in step S69 by the system control circuit 16 is NO and the determination result in step S71 by the system control circuit 16 is YES, the system control circuit 16 terminates the discharging of the K-th standard cell 20st (turns off the switch SWst provided for the K-th standard cell 20st) in step S73, and then proceeds to step S75.

In step S75, the system control circuit 16 determines whether the variable K has reached the variable Kmax. In step S79, the system control circuit 16 determines whether the discharging of all the Kmax standard cells 20st has completed. When the determination result in step S75 by the system control circuit 16 is NO, the system control circuit 16 increments the variable K in step S77, and then returns to step S69.

When the determination result in step S75 by the system control circuit 16 is YES but the determination result in step S79 by the system control circuit 16 is NO, the system control circuit 16 returns to step S67. When the determination result in step S75 and the determination result in step S79 by the system control circuit 16 are all YES, the system control circuit 16 terminates this balance adjustment process.

As understood from the foregoing description, the assembled battery 20 is formed from the Kmax standard cells 20st having the standard capacitance and the single twofold cell 20tw having the capacitance twofold larger than the standard capacitance. When detecting the SOC of the reference standard cell 20st (i.e., the standard cell 20st specified in advance from among the Kmax standard cells 20st), the system control circuit 16 acquires from the memory 16m the potential difference-SOC characteristic curve CVdf indicating the relationship between the potential difference between the reference standard cell 20st and the twofold cell 20tw and the SOC of the reference standard cell 20st (S1), detects the potential difference between the reference standard cell 20st and the twofold cell 20tw (S19), and then compares the detected potential difference with the potential difference-SOC characteristic curve CVdf to detect the SOC value of the reference standard cell 20st (S21).

When adjusting the charge balance among the Kmax standard cells 20st, the system control circuit 16 acquires from the memory 16m the Kmax potential difference-SOC characteristic curves CVdf corresponding to the Mmax standard cells 20st (S31), detects the potential differences between each of the K-th (K: 1 to Kmax) standard cells 20st and the twofold cell 20tw (S37), and compares the detected potential differences with the K-th potential difference-SOC characteristic curves CVdf to the SOC values of the K-th standard cells 20st (S39).

Each of the standard cells 20st has the standard capacitance (i.e., the first capacitance) and the twofold cell 20tw has the capacitance (i.e., the second capacitance) exceeding the standard capacitance. Accordingly, the potential difference may fluctuate significantly on the potential difference- SOC characteristic curve CVdf even in the SOC region (i.e., potential plateau region) with less fluctuation in the voltage of the standard cell 20st. Using the potential difference-SOC characteristic curves CVdf enables the detection of the SOC values of the standard cells 20st even in the potential plateau region in an easy and accurate manner, and adjust the charge balance among the standard cells 20st based on the detected SOC values.

As described above, the material and design of the two-fold cell 20tw are identical to the material and design of the standard cells 20st, and thus identical rate characteristics and lifetime characteristics can be obtained. This makes it possible to suppress a work load on the re-balancing between the twofold cell 20tw and the standard cells 20st.

Further, the open-circuit voltage of the twofold cell 20tw is low but the twofold cell 20tw has a high capacitance, and thus the internal resistance of the twofold cell 20tw is relatively low. As a result, the amount of reduction in the open-circuit voltage at a high rate is suppressed (i.e., the output voltage is unlikely to drop).

Figure 11:
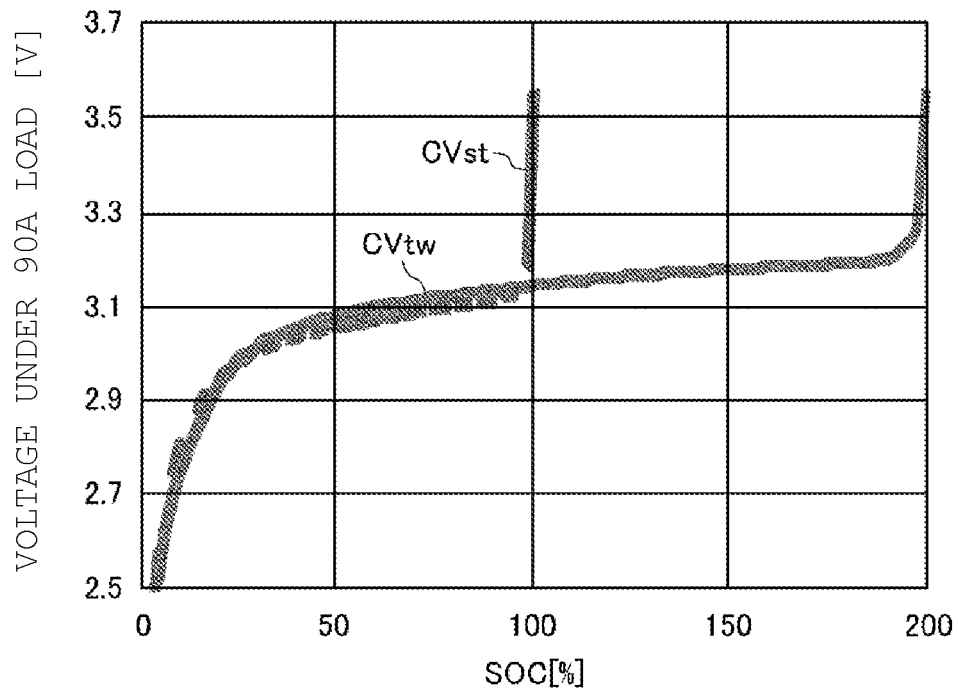
FIG. 11 is a graph illustrating an example of relationship between open-circuit voltage and SOC of the twofold cell or the standard cell under a 90A load.

For reference, FIG. 11 illustrates output characteristics under a load of 90A. Introducing the high-capacitance (i.e., low-resistance) twofold cell 20tw makes it possible to suppress voltage drop under high load (e.g., large current) in particular and obtain high power.

Figure 12:
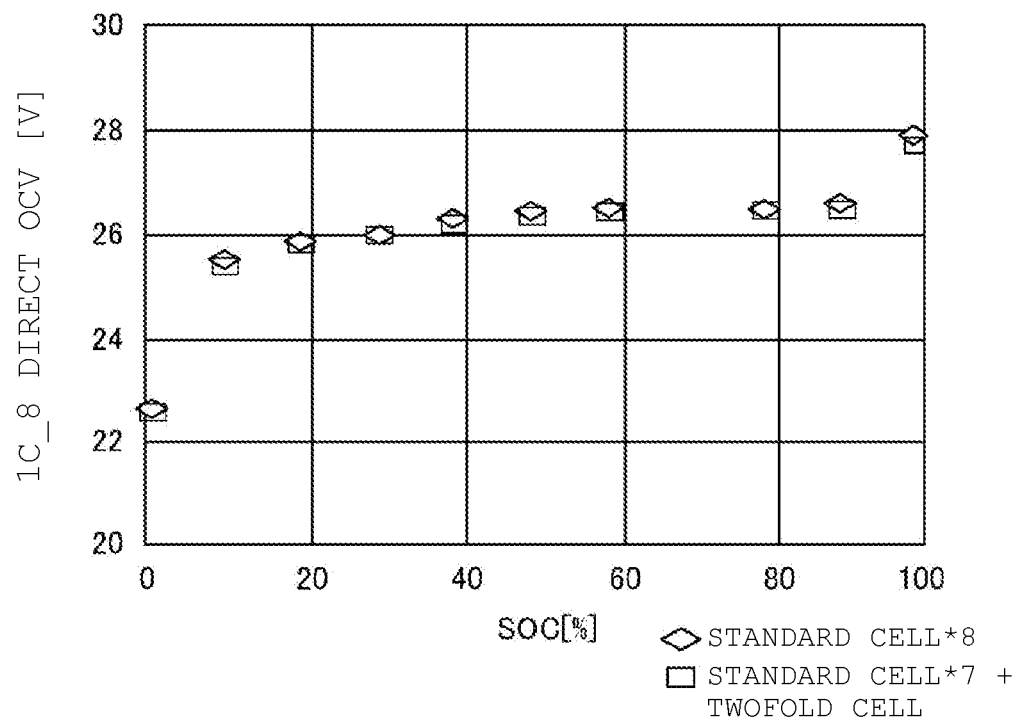
FIG. 12 is a graph indicating an example of relationship between open-circuit voltage and SOC of the assembled battery.

Further, when the open-circuit voltage of an assembled battery formed from the eight standard cells 20st varies along rhombuses illustrated in FIG. 12, the open-circuit voltage of the assembled battery 20 in this example varies along squares illustrated in FIG. 12. That is, the OCV-SOC characteristics of the assembled battery 20 are almost identical to the OCV-SOC characteristics of an assembled battery formed from only the standard cells 20st.

This is because the open-circuit voltage of the twofold cell 20tw is flat in a wide range and the number of the twofold cell 20tw provided in the assembled battery 20 is one. Accordingly, the charging/discharging control of each assembled battery can be made uniform regardless whether the single standard cells 20st are replaced by the twofold cells 20st.

In this example, one twofold cell 20tw is provided in the assembled battery 20. Alternatively, two or more twofold cells 20tw may be provided in the assembled battery 20. In addition, in this example, the high-capacitance cell with the capacitance twofold larger than the standard capacitance (i.e., the twofold cell 20tw) is provided in the assembled battery 20. Alternatively, the capacitance of the high-capacitance cell may be changed as appropriate within a range of 1.2 to 3.0 times larger than the standard capacitance.

Further, in this example, the assembled battery circuit 10 includes the single assembled battery 20. Alternatively, the assembled battery circuit 10 may have a plurality of assembled batteries 20 connected in parallel or in series to execute the processes described in FIGS. 6 to 10 in each of the assembled batteries 20.

In this example, the SOC values of the standard cells 20st are detected. Alternatively, the SOH values of the standard cells 20st may be detected.

The SOHs of the standard cells 20st can be described as "present fully charged capacitances of the standard cells 20st with respect to the fully charged capacitances of the standard cells 20st before deterioration", and the SOH of the twofold cell 20tw can be described as "present fully charged capacitance of the twofold cell 20tw with respect to the fully charged capacitance of the twofold cell 20tw before deterioration".

Figure 13:
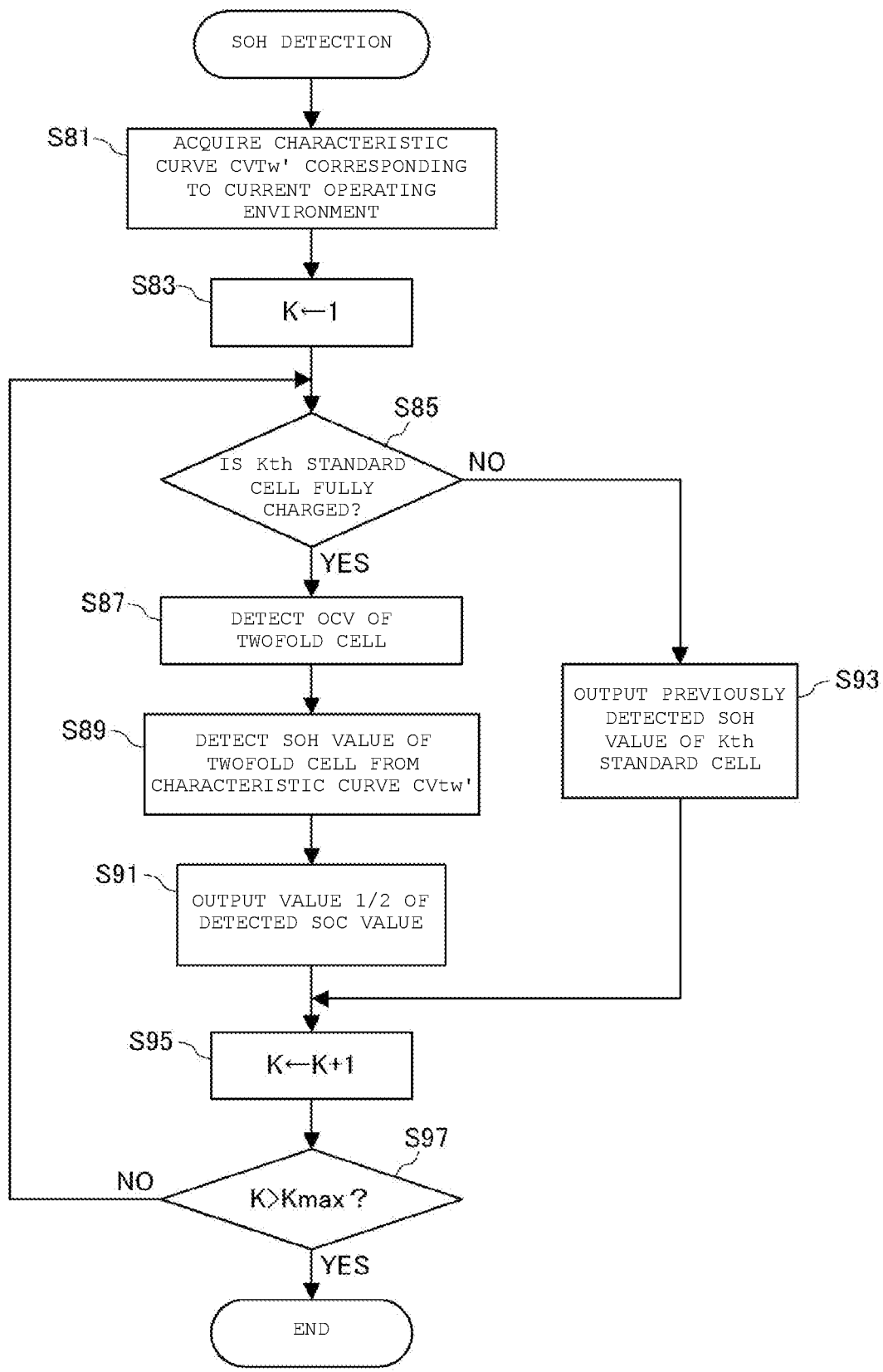
FIG. 13 is a flowchart of exemplary performed by a system control circuit in another embodiment.

To detect these parameters, it is necessary to store in the memory 16m twofold cell voltage-SOH characteristic curves CVtw' indicating the relationship between the open-circuit voltage of the twofold cell 20tw and the SOH of the twofold cell 20tw (the number of the curves CVtw' to be stored=the number of operating environments), and perform the process described in FIG. 13 instead of the process described in FIGS. 6 and 7. Due to the nature of SOH, there is no need for the balance adjustment as illustrated in FIGS. 8 to 10.

Referring to FIG. 13, in step S81, the system control circuit 16 acquires from the memory 16m the twofold cell voltage-SOH characteristic curves CVtw' corresponding to the present operating environment. In step S83, the system control circuit 16 sets the variable K to "1", and in step S85, the system control circuit 16 determines whether the K-th standard cell 20st is in a fully charged state.

When the determination result by the system control circuit 16 is YES, the system control circuit 16 proceeds to step S87 to detect the present open-circuit voltage of the twofold cell 20tw. In step S89, the system control circuit 16 compares the detected open-circuit voltage detected in step S87 with the twofold cell voltage-SOH characteristic curve CVtw' acquired in step S81 to detect the present SOH value of the twofold cell 20tw. In step S91, the system control circuit 16 outputs the value ½ of the detected SOH value as the present SOH value of the K-th standard cell 20st to the monitor to be displayed thereon. Upon completion of the output, the system control circuit 16 proceeds to step S95.

When the determination result in step S85 by the system control circuit 16 is NO, the system control circuit 16 proceeds to step S93 to output the SOH value of the K-th standard cell detected in step S91 of the previous process to the monitor. Upon completion of the output, the system control circuit 16 proceeds to step S95.

In step S95, the system control circuit 16 increments the variable K, and in step S97, the system control circuit 16 determines whether the variable K exceeds the constant Kmax. When the determination result by the system control circuit 16 is NO, the system control circuit 16 returns to step S85. When the determination result by the system control circuit 16 is YES, the system control circuit 16 terminates this SOH detection process.

DESCRIPTION OF REFERENCE SYMBOLS

10: Assembled battery circuit
12: System power supply
14: Load
16: System control circuit
18: Charge/discharge circuit
20: Assembled battery
20tw: twofold cell
20st: Standard cell

The invention claimed is:

1. An assembled battery circuit for controlling charging and discharging of an assembled battery that includes a standard cell having a first capacitance and a specific cell having a second capacitance greater than the first capacitance, the assembled battery circuit comprising:
a potential difference-capacitance coefficient characteristic curve acquisition unit configured to acquire from a memory a potential difference-capacitance coefficient characteristic curve indicating a relationship between a potential difference between the standard cell and the specific cell and a standard cell capacitance coefficient indicating a current capacitance of the standard cell relative to a fully-charged capacitance of the standard cell before deterioration of the standard cell;
a potential difference detector configured to detect the potential difference between the standard cell and the specific cell; and
a standard cell capacitance coefficient value detector configured to compare the detected potential difference with the acquired potential difference-capacitance coefficient characteristic curve to detect a current value of the standard cell capacitance coefficient.

2. The assembled battery circuit according to claim 1, further comprising a cell voltage-capacitance coefficient characteristic curve acquisition unit configured to acquire from the memory at least one of a standard cell voltage-capacitance coefficient characteristic curve that indicates a relationship between a voltage of the standard cell and the standard cell capacitance coefficient and a specific cell voltage-capacitance coefficient characteristic curve that indicates a relationship between a voltage of the specific cell and a specific cell capacitance coefficient indicating a current capacitance of the specific cell relative to a fully-charged capacitance of the specific cell before deterioration of the specific cell.

3. The assembled battery circuit according to claim 2, further comprising a standard cell capacitance coefficient value selector configured to select, when a number of values of the detected standard cell capacitance coefficient is at least two, a unique value of the standard cell capacitance coefficient based on the characteristic curve acquired by the cell voltage-capacitance coefficient characteristic curve acquisition unit.

4. The assembled battery circuit according to claim 1, further comprising a standard cell capacitance coefficient value output unit configured to output for display the value of the detected standard cell capacitance coefficient.

5. The assembled battery circuit according to claim 1, wherein the standard cell comprises a plurality of standard cells.

6. The assembled battery circuit according to claim 5, further comprising a balance adjustor configured to adjust a charging balance among the plurality of standard cells based on the value of the standard cell capacitance coefficient of each of the plurality of standard cells detected by the standard cell capacitance coefficient value detector.

7. The assembled battery circuit according to claim 6, wherein the specific cell is connected in series to the plurality of standard cells, such that a voltage of the specific cell and respective voltages of the plurality of standard cells coincide with each other in a position where the respective values of the standard cell capacitance coefficient and the specific cell capacitance coefficient are zero.

8. A capacitance coefficient detection method for controlling charging and discharging of an assembled battery that includes a standard cell having a first capacitance and a specific cell having a second capacitance greater than the first capacitance, the method comprising:
acquiring, from a memory, a potential difference-capacitance coefficient characteristic curve that indicates a relationship between a potential difference between the standard cell and the specific cell and a standard cell capacitance coefficient that indicates a current capacitance of the standard cell relative to a fully-charged capacitance of the standard cell before deterioration of the standard cell;
detecting a potential difference between the standard cell and the specific cell; and
comparing the detected potential difference with the acquired potential difference-capacitance coefficient characteristic curve to detect a current value of the standard cell capacitance coefficient.

9. The method according to claim 8, further comprising acquiring, from the memory, at least one of a standard cell voltage-capacitance coefficient characteristic curve that indicates a relationship between a voltage of the standard cell and the standard cell capacitance coefficient and a specific cell voltage-capacitance coefficient characteristic curve that indicates a relationship between a voltage of the specific cell and a specific cell capacitance coefficient indicating a current capacitance of the specific cell relative to a fully-charged capacitance of the specific cell before deterioration of the specific cell.

10. The method according to claim 9, further comprising selecting, when a number of values of the detected standard cell capacitance coefficient is at least two, a unique value of the standard cell capacitance coefficient based on the acquired at least one standard cell voltage-capacitance coefficient characteristic curve and the specific cell voltage-capacitance coefficient characteristic curve.

11. The method according to claim 8, further comprising outputting for display the value of the detected standard cell capacitance coefficient.

12. The method according to claim 8, wherein the standard cell comprises a plurality of standard cells.

13. The method according to claim 12, further comprising adjusting a charging balance among the plurality of standard cells based on the detected value of the standard cell capacitance coefficient of each of the plurality of standard cells.

14. The method according to claim 13, wherein the specific cell is connected in series to the plurality of standard cells, such that a voltage of the specific cell and respective voltages of the plurality of standard cells coincide with each other in a position where the respective values of the standard cell capacitance coefficient and the specific cell capacitance coefficient are zero.

15. A non-transitory computer-readable medium having stored thereon a capacitance coefficient detection program for controlling charging and discharging of an assembled battery that includes a standard cell having a first capacitance and a specific cell having a second capacitance greater than the first capacitance, the capacitance coefficient detection program, when executed by a processor, being configured to:
acquire, from a memory, a potential difference-capacitance coefficient characteristic curve that indicates a relationship between a potential difference between the standard cell and the specific cell and a standard cell capacitance coefficient that indicates a current capacitance of the standard cell relative to a fully-charged capacitance of the standard cell before deterioration of the standard cell;
detect a potential difference between the standard cell and the specific cell; and
compare the detected potential difference with the acquired potential difference-capacitance coefficient characteristic curve to detect a current value of the standard cell capacitance coefficient.

16. The capacitance coefficient detection program according to claim 15 that, when executed by the processor, is further configured to:
acquire, from the memory, at least one of a standard cell voltage-capacitance coefficient characteristic curve that indicates a relationship between a voltage of the standard cell and the standard cell capacitance coefficient and a specific cell voltage-capacitance coefficient characteristic curve that indicates a relationship between a voltage of the specific cell and a specific cell capacitance coefficient indicating a current capacitance of the specific cell relative to a fully-charged capacitance of the specific cell before deterioration of the specific cell; and select, when a number of values of the detected standard cell capacitance coefficient is at least two, a unique value of the standard cell capacitance coefficient based on the acquired at least one standard cell voltage-capacitance coefficient characteristic curve and the specific cell voltage-capacitance coefficient characteristic curve.

17. The capacitance coefficient detection program according to claim 15 that, when executed by the processor, is further configured to output the value of the detected standard cell capacitance coefficient.

18. The capacitance coefficient detection program according to claim 15, wherein the standard cell comprises a plurality of standard cells.

19. The capacitance coefficient detection program according to claim 18 that, when executed by the processor, is further configured to adjust a charging balance among the plurality of standard cells based on the detected value of the standard cell capacitance coefficient of each of the plurality of standard cells.

20. The capacitance coefficient detection program according to claim 19, wherein the specific cell is connected in series to the plurality of standard cells, such that a voltage of the specific cell and respective voltages of the plurality of standard cells coincide with each other in a position where the respective values of the standard cell capacitance coefficient and the specific cell capacitance coefficient are zero.

* * * * *